(12) United States Patent
Kishimoto (10) Patent No.: US 9,419,671 B2
(45) Date of Patent: Aug. 16, 2016

(54) MOBILE DEVICE

(71) Applicant: Alps Electric Co., Ltd., Tokyo (JP)

(72) Inventor: Yoshihisa Kishimoto, Miyagi-ken (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/757,717

(22) Filed: Dec. 23, 2015

(65) Prior Publication Data
US 2016/0191096 A1 Jun. 30, 2016

(30) Foreign Application Priority Data
Dec. 26, 2014 (JP) ................................. 2014-265799

(51) Int. Cl.
| | | |
|---|---|---|
| H04B 17/00 | (2015.01) | |
| H04B 1/3888 | (2015.01) | |
| H04B 1/3883 | (2015.01) | |
| H04B 1/3827 | (2015.01) | |
| H04B 17/10 | (2015.01) | |
| H04B 17/20 | (2015.01) | |

(52) U.S. Cl.
CPC ............ *H04B 1/3888* (2013.01); *H04B 1/3833* (2013.01); *H04B 1/3883* (2013.01); *H04B 17/10* (2015.01); *H04B 17/20* (2015.01)

(58) Field of Classification Search
CPC ....... H04B 1/3888; H04B 17/10; H04B 17/20
USPC ...................................................... 455/67.11
See application file for complete search history.

(56) References Cited

U.S. PATENT DOCUMENTS 4,377,003 A * 3/1983 Abe ......................... H04B 1/16
455/326

FOREIGN PATENT DOCUMENTS

JP 2013-100657 5/2013

* cited by examiner

*Primary Examiner* — Eugene Yun
(74) *Attorney, Agent, or Firm* — Brinks Gilson & Lione (57) ABSTRACT

A mobile device includes a circuit board on which an electronic circuit used to perform wireless communication with a vehicle-mounted device is mounted, a battery holder that holds a battery from which electric power is supplied to the electronic circuit, and a case member in which the circuit board and the battery holder are accommodated. Test ports, which are terminal electrodes used in test of the electronic circuit, are provided on one plate surface of the circuit board. The battery holder holds the battery at a position at which the battery faces the test ports.

7 Claims, 10 Drawing Sheets

FIG. 10B
PRIOR ART

MOBILE DEVICE

CLAIM OF PRIORITY

This application claims benefit of priority to Japanese Patent Application No. 2014-265799 filed on Dec. 26, 2014, which is hereby incorporated by reference in its entirety.

BACKGROUND

1. Field of the Disclosure

The present disclosure relates to a mobile device, and more particularly to a mobile device that performs wireless communication with a vehicle-mounted device.

2. Description of the Related Art

Presently, a system, called a keyless entry system, is in use. The system includes a vehicle-mounted device, which is mounted in a vehicle, and a mobile device, called an electronic key, carried by the user of the vehicle. According to a result in wireless communication between the vehicle-mounted device and the mobile device, the system allows a door of the vehicle to be locked or unlocked, allows the engine to be started, and performs other tasks.

The mobile device used in the keyless entry system includes a circuit board on which an electronic circuit used to perform wireless communication with the vehicle-mounted device is mounted, a battery holder that holds a battery from which electric power is supplied to the electronic circuit, and a case member in which the circuit board and battery holder are accommodated. On the front surface of the circuit board, test ports are usually provided that are test terminal electrodes used to inspect the performance of the electronic circuit before the mobile device is shipped as a product.

Figure 10A:
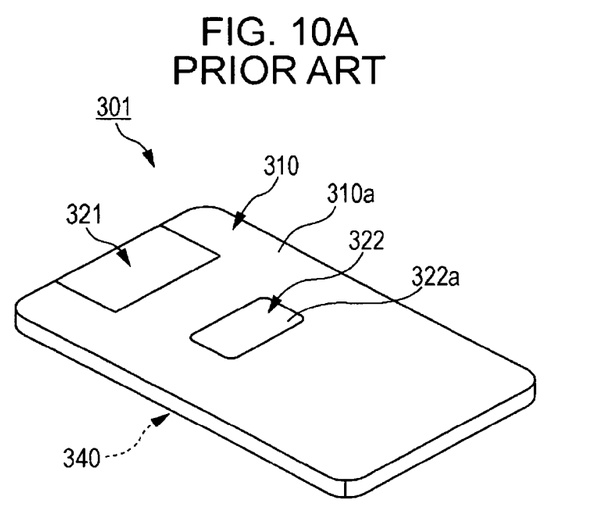
FIGS. 10A and 10B illustrate the structure of a conventional mobile device.
Figure 10B:
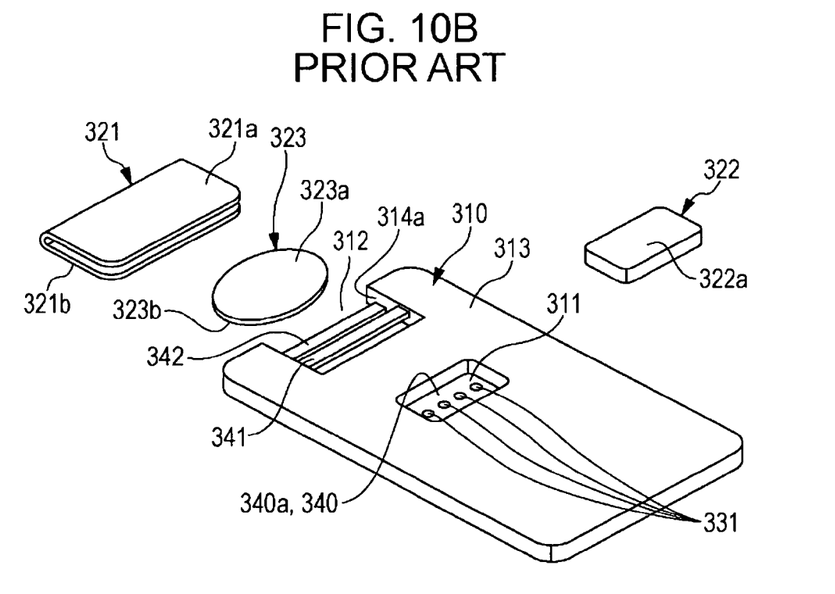

An example of a conventional mobile device used in this type of system is described in Japanese Unexamined Patent Application Publication No. 2013-100657. The structure of the conventional mobile device described in Japanese Unexamined Patent Application Publication No. 2013-100657 will be described with reference to FIGS. 10A and 10B. FIGS. 10A and 10B illustrate the structure of the conventional mobile device, which is a card key 301 (mobile device) described in Japanese Unexamined Patent Application Publication No. 2013-100657.

As illustrated in FIGS. 10A and 10B, the card key 301 is a mobile device shaped like a card. It includes a card key main body 310, which is the main body of the card key 301, and an ornament 322 with a vehicle manufacturer and a model indicated on the surface 322a of the ornament 322. The card key main body 310 includes a circuit board 340 on which an electronic circuit used to perform wireless communication is formed and also includes a molded resin 313 (case member) in which the circuit board 340 is accommodated. A recess 311 into which the ornament 322 is fitted is formed in the vicinity of the center of a surface 310a of the card key main body 310. A battery space 312 (battery holder) in which a battery 323 of a button type is installed is provided at an end of the card key main body 310.

An electronic part (not illustrated) is mounted on the circuit board 340, forming an electronic circuit used for wireless communication. A plurality of test points 331 (test ports), which are test terminal electrodes, are formed on the surface 340a (one of the plate surfaces) of the circuit board 340. The test points 331 are disposed at the position at which the recess 311 in the card key main body 310 is formed, so a test probe or the like can be brought into contact with the test points 331 before the ornament 322 is fitted into the recess 311 to check the performance of the electronic circuit.

A battery terminal 341, a battery terminal 342, and a plurality of lands 361 are accommodated in the battery space 312. The battery terminal 341 is an electrode that comes into contact with the surface 323a (electrode surface) of the battery 323 on the positive electrode side when the battery 323 is installed. The battery terminal 342 is a ground electrode that comes into contact with the surface 323b (electrode surface) of the battery 323 on the negative electrode side when the battery 323 is installed. The lands 361 are electrodes that come into contact the surface 323b of the battery 323 on the negative electrode side when the battery 323 is installed. The lands 361 are connected to their corresponding test points 331. After the battery 323 is installed in the battery space 312, a battery cover 321 is attached around the battery space 312 so as to cover the battery 323.

The card key 301 is structured as described above. With the card key 301, when the card key 301 is used with the battery 323 installed in the battery space 312 (simply referred to below as "when the card key 301 is used"), the surface 323b of the battery 323 on the negative electrode side comes into contact with the battery terminal 342 and lands 361, causing the test points 331 to be grounded. Since the test points 331 are grounded when the card key 301 is used, it is prevented that static electricity enters the electronic circuit from the test points 331.

The case member where a mobile device is made of a synthetic resin or another material through which electromagnetic waves can easily pass so that wireless communication with a vehicle-mounted device is not interfered. Test ports are provided so as to be exposed to the surface of a circuit board, and need to have a large size to a certain extent so that a test probe can be easily brought into contact with the test ports. Accordingly, electromagnetic wave noise that has intruded from the outside of the mobile device can easily enter the test ports. This has been problematic in that, if no countermeasures against noise are taken, the electromagnetic wave noise that has entered the test ports may be transmitted toward the electronic circuit and the electronic circuit may thereby be adversely influenced.

The adverse influence of electromagnetic wave noise on the electronic circuit is further increased if the test ports are disposed near wiring electrodes connected to an electronic part such as an IC chip. However, this type of mobile device is required to be compact so as to be easy to carry. Therefore, the test ports are often disposed near wiring electrodes connected to an electronic part, in which case countermeasures against noise have been particularly important.

In view of this, the test points 331 (test ports) of the card key 301 (mobile device) described in Japanese Unexamined Patent Application Publication No. 2013-100657 are grounded when the card key 301 is used so that it is possible to suppress the electromagnetic wave noise that has entered the test points 331 from the outside of the card key 301 from being transmitted toward the electronic circuit. In the structure described in Japanese Unexamined Patent Application Publication No. 2013-100657, however, the transmission of the electromagnetic wave to the test ports can be suppressed only when all tests ports can be grounded while the mobile device is in use. Therefore, if the circuit board includes a test port that cannot be grounded while the mobile device is in use, such as, for example, a test port that is electrically connected to a switch element used for an input operation, it is not possible to suppress the adverse influence of electromagnetic wave noise that has entered the test port from the outside of the mobile device.

SUMMARY

A mobile device comprises an electronic circuit, used to perform wireless communication with a vehicle-mounted device, mounted circuit board. A battery holder holds a battery from which electric power is supplied to the electronic circuit, and a case member in which the circuit board and battery holder are accommodated. Test ports are provided on one plate surface of the circuit board, the test ports being terminal electrodes used in test of the electronic circuit; the battery holder holds the battery at a position at which the battery faces the test ports.

With the mobile device having this structure, the battery holder holds the battery at which the battery faces the test ports. The surfaces of the battery are usually covered with a conductive member made of a metal or the like. Therefore, on the surfaces of the battery, which is covered with the conductive member, it is possible to block electromagnetic wave noise that would otherwise intrude from the battery side toward the test ports. As a result, the adverse influence of electromagnetic wave noise on the electronic circuit can be suppressed without having to ground the test ports.

DESCRIPTION OF THE EXEMPLARY EMBODIMENTS

Figure 1A:
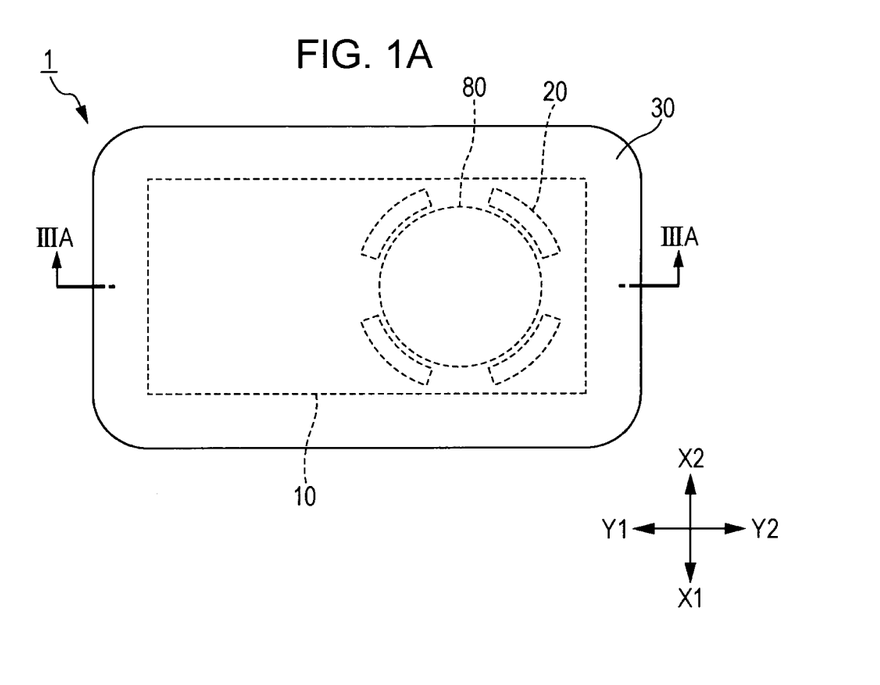
FIGS. 1A and 1B illustrate the structure of a mobile device according to a first embodiment of the present invention.
Figure 1B:
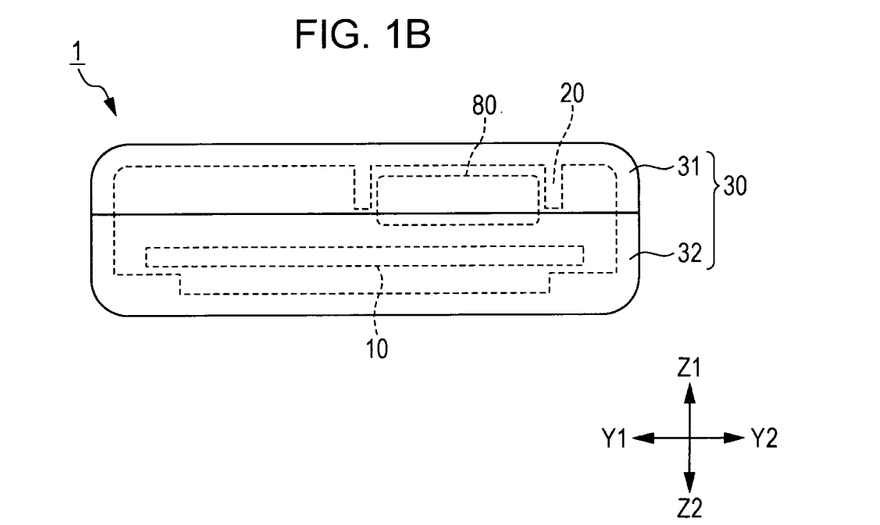
Figure 2A:
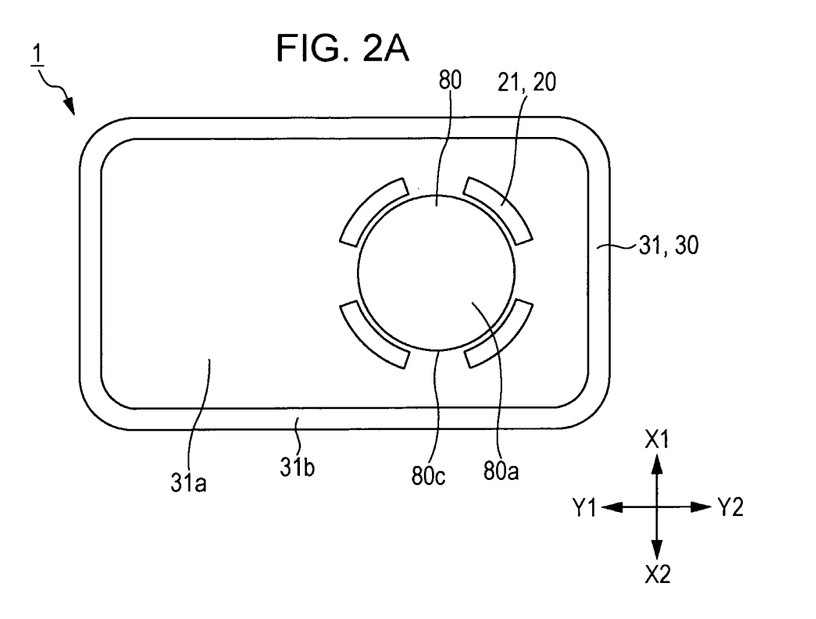
FIGS. 2A and 2B also illustrate the structure of the mobile device according to the first embodiment of the present invention.
Figure 2B:
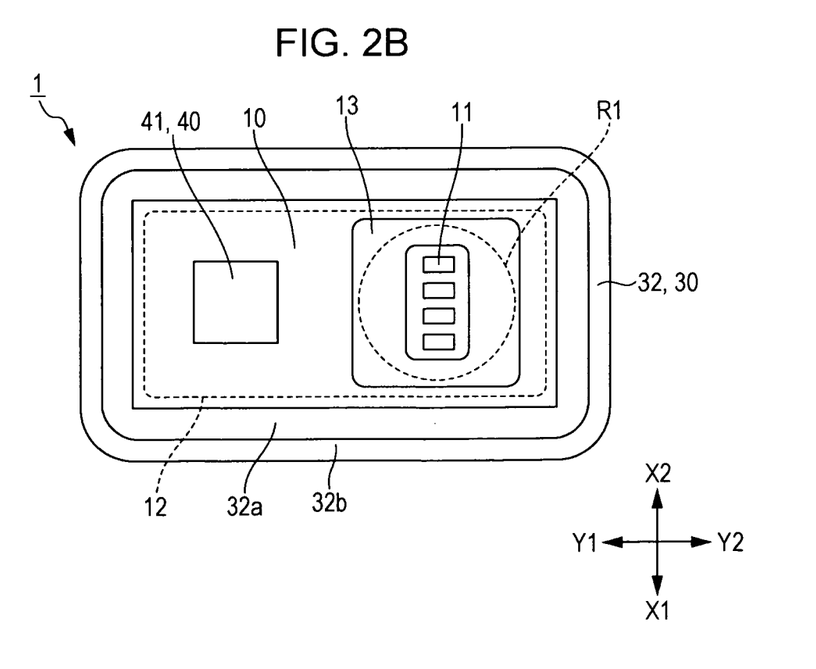
Figure 3A:
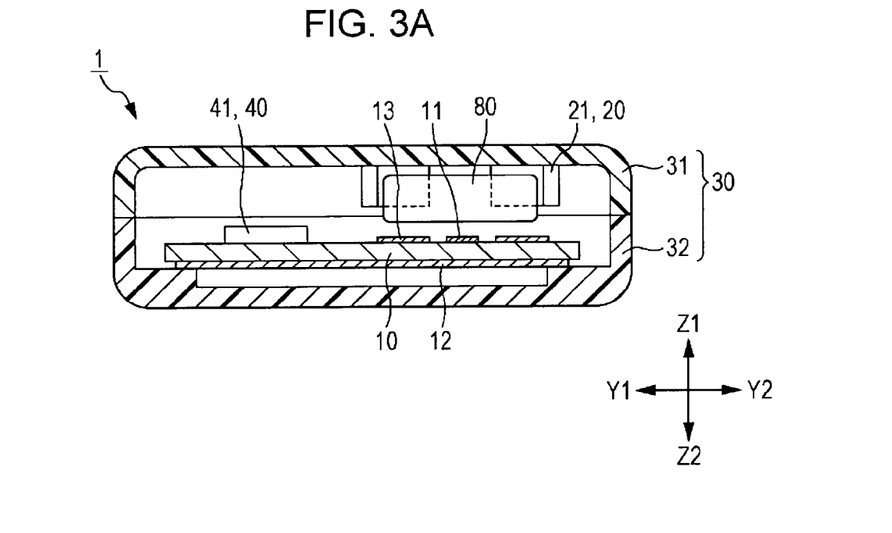
FIGS. 3A and 3B also illustrate the structure of the mobile device according to the first embodiment of the present invention.
Figure 3B:
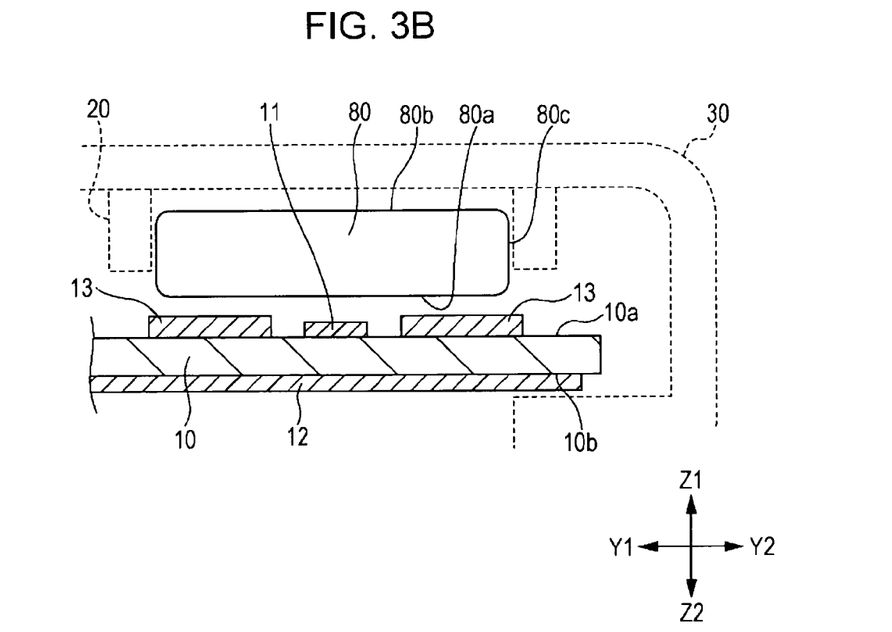

Embodiments of the present invention will be described below with reference to FIGS. 1A to 1B to FIGS. 9A and 9B. FIGS. 1A and 1B illustrate the structure of a mobile device according to a first embodiment of the present invention; FIG. 1A is a schematic view when the mobile device 1 is viewed from above, and FIG. 1B is a schematic view when the mobile device 1 is viewed from left. FIGS. 2A and 2B also illustrate the structure of the mobile device according to the first embodiment of the present invention; FIG. 2A is a schematic view when an upper case 31 and a battery 80 are viewed from below, and FIG. 2B is a schematic view when a lower case 32 and a circuit board 10 are viewed from above. FIGS. 3A and 3B also illustrate the structure of the mobile device according to the first embodiment of the present invention; FIG. 3A is a schematic cross-sectional view of the mobile device 1 as taken along line IIIA-IIIA in FIG. 1A, and FIG. 3B is a schematic cross-sectional view in which the rear side of the circuit board 10 and the battery 80 in FIG. 3A are enlarged.

Figure 4A:
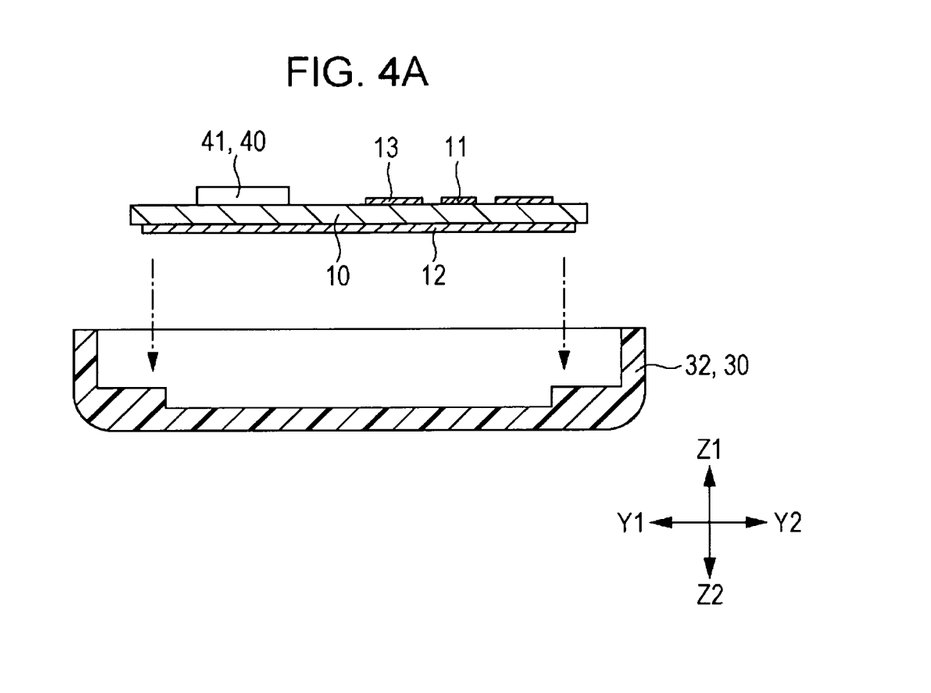
FIGS. 4A and 4B illustrate a method of assembling the mobile device according to the first embodiment of the present invention.
Figure 4B:
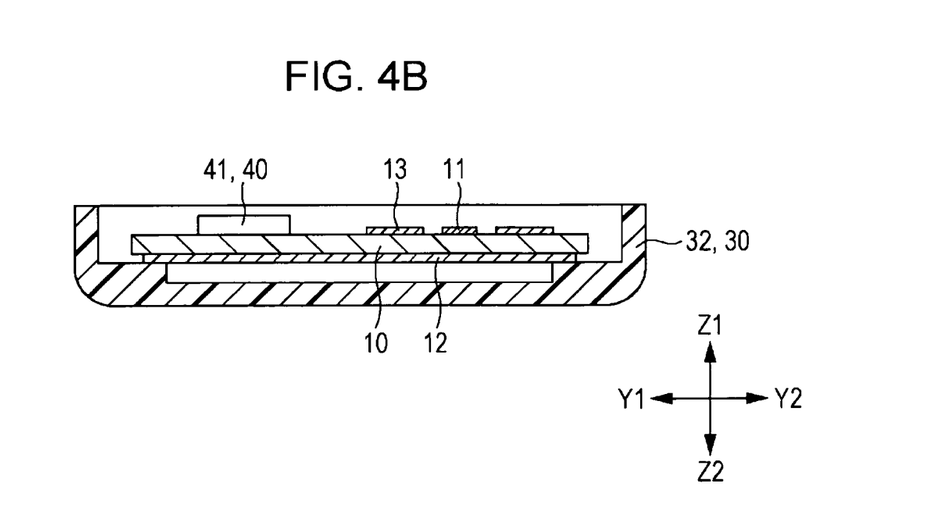
Figure 5A:
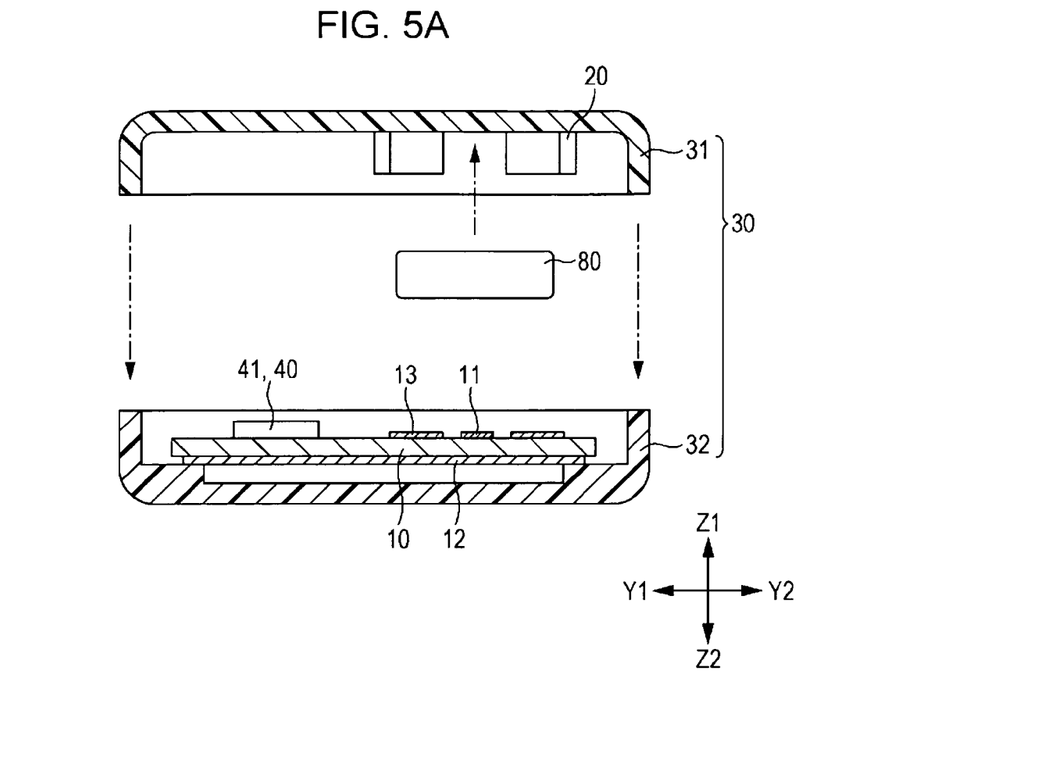
FIGS. 5A and 5B also illustrate the method of assembling the mobile device according to the first embodiment of the present invention.
Figure 5B:
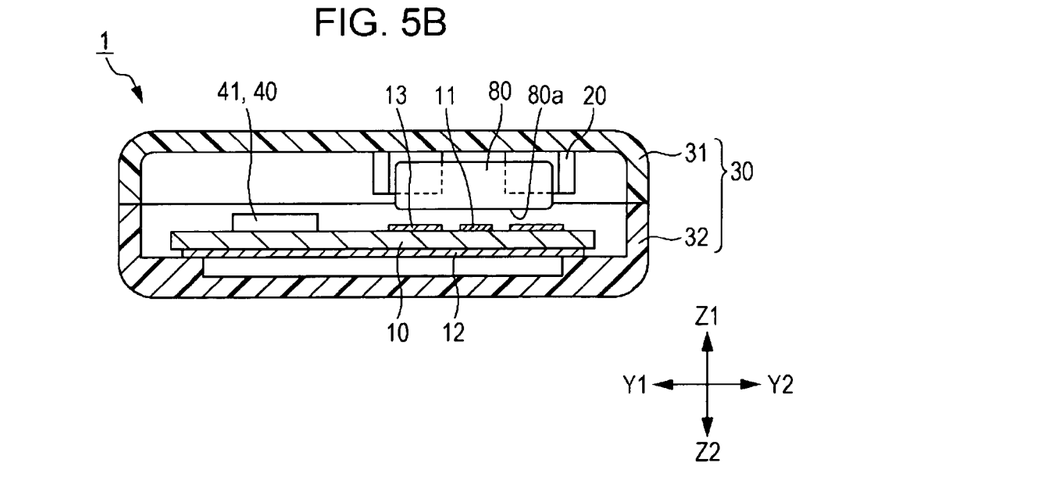
Figure 6:
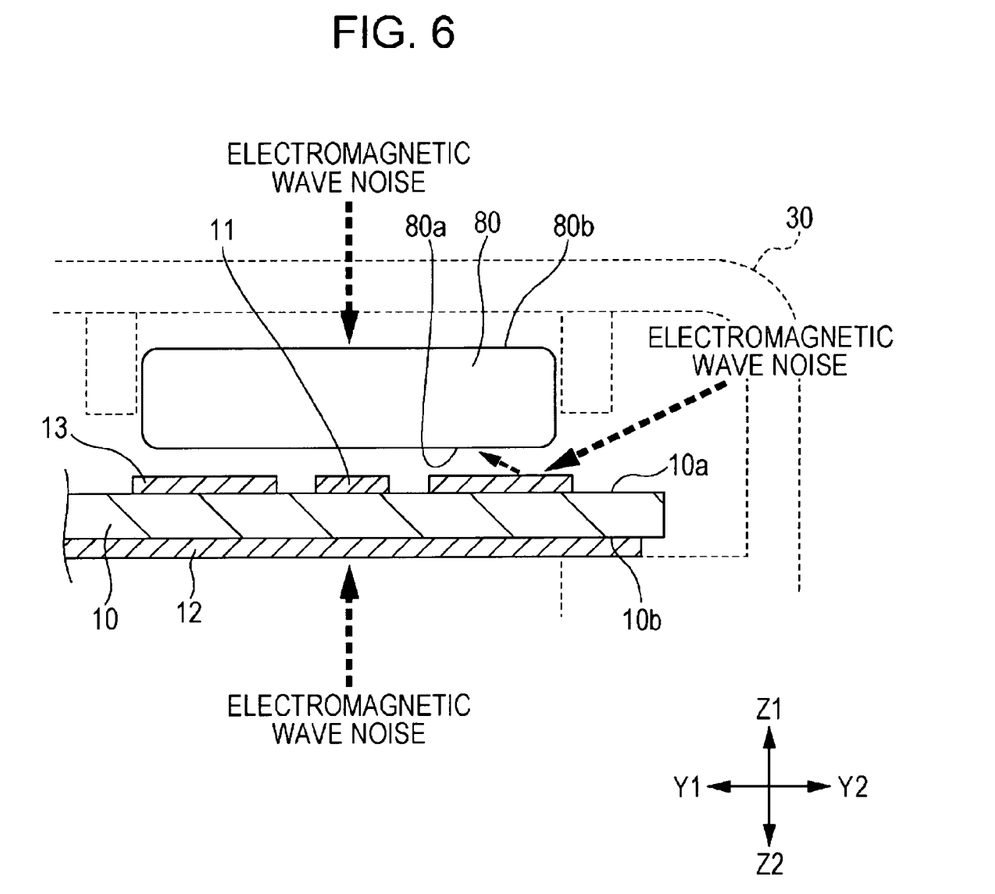
FIG. 6 illustrates the effect of suppressing electromagnetic wave noise according to the first embodiment of the present invention.

FIGS. 4A and 4B illustrate a method of assembling the mobile device according to the first embodiment of the present invention; FIG. 4A illustrates a state before the circuit board 10 is attached to the lower case 32, and FIG. 4B illustrates a state after the circuit board 10 has been attached to the lower case 32. FIGS. 5A and 5B also illustrate the method of assembling the mobile device according to the first embodiment of the present invention; FIG. 5A illustrates a state before the upper case 31 is attached to the lower case 32, and FIG. 5B illustrates a state after the upper case 31 has been attached to the lower case 32. FIG. 6 illustrates the effect of suppressing electromagnetic wave noise according to the first embodiment of the present invention. In FIG. 6, electromagnetic wave noise intrudes in directions indicated by the dotted arrows.

Figure 7A:
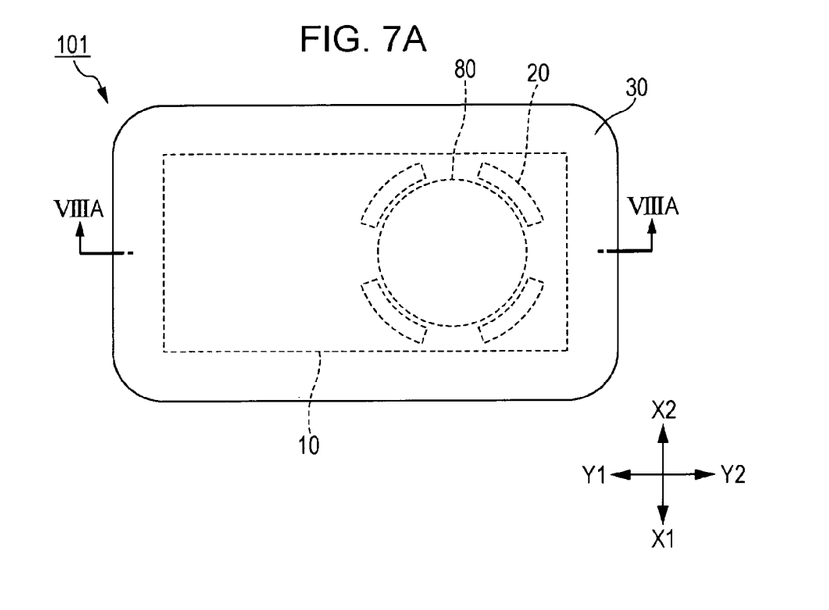
FIGS. 7A and 7B illustrate the structure of a mobile device according to a second embodiment of the present invention.
Figure 7B:
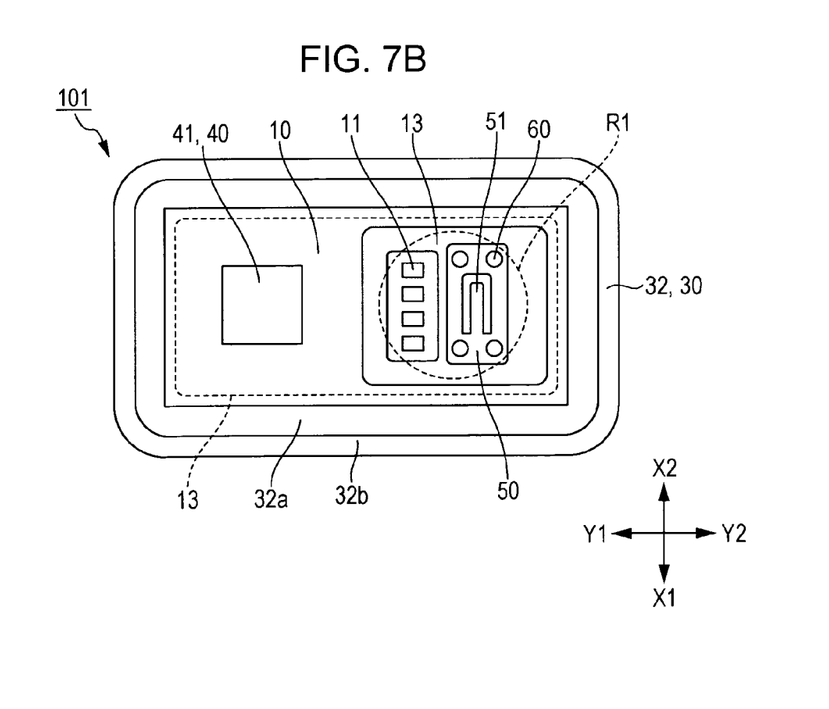
Figure 8A:
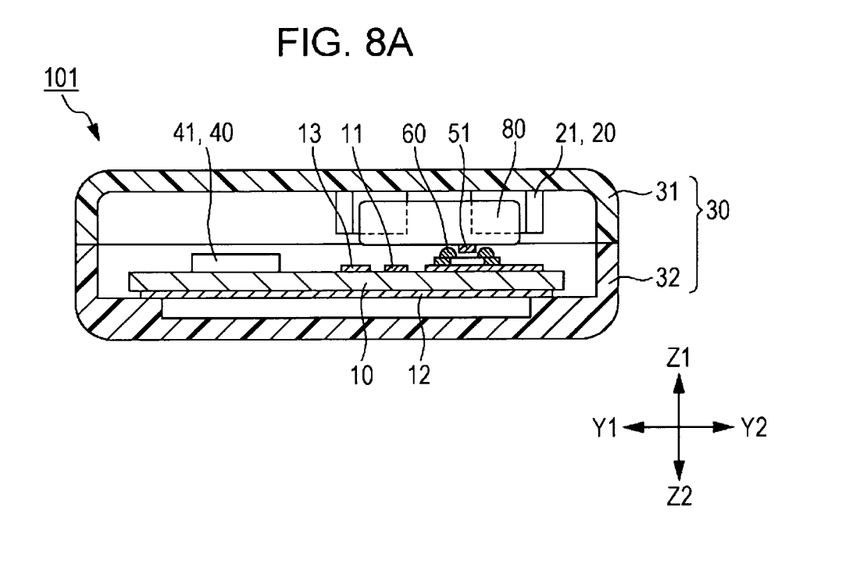
FIGS. 8A and 8B also illustrate the structure of the mobile device according to the second embodiment of the present invention.
Figure 8B:
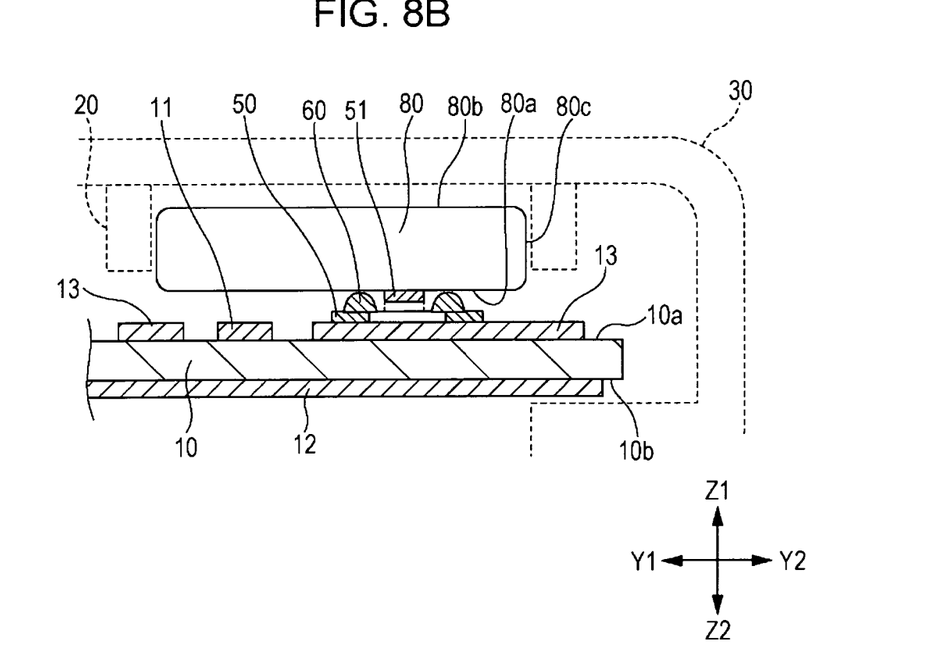
Figure 9A:
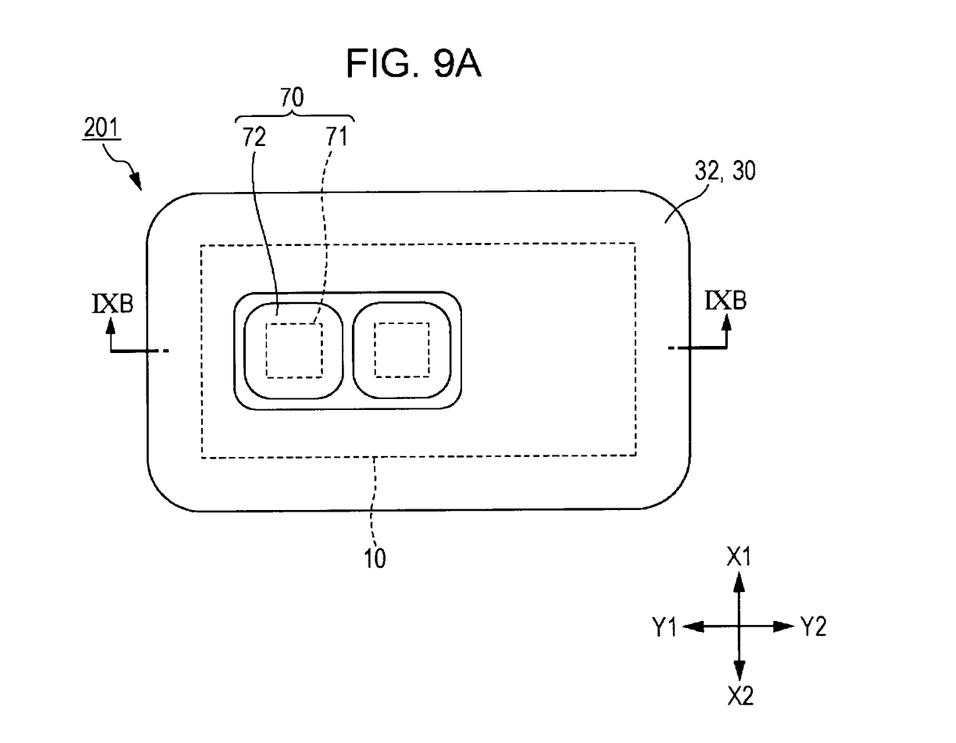
FIGS. 9A and 9B illustrate the structure of a mobile device according to a third embodiment of the present invention.
Figure 9B:
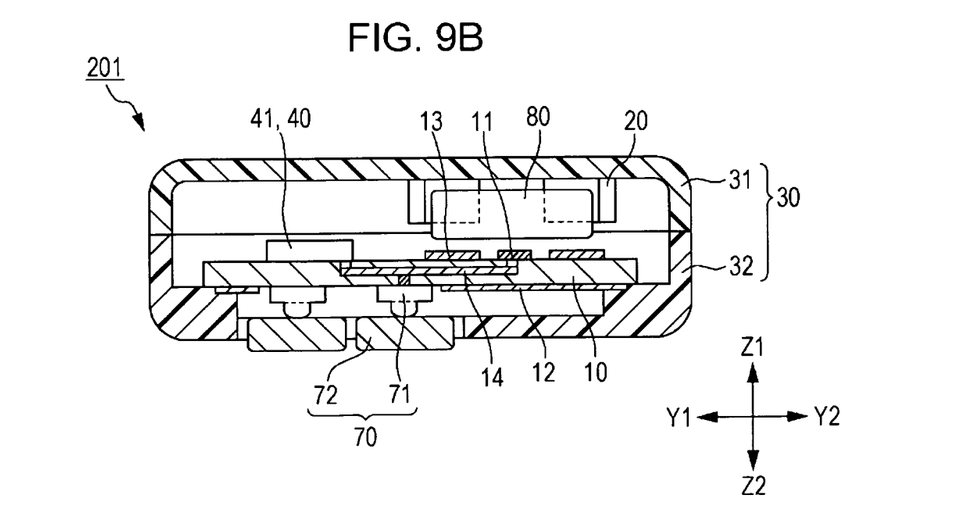

FIGS. 7A and 7B illustrate the structure of a mobile device according to a second embodiment of the present invention; FIG. 7A is a schematic view when a mobile device 101 is viewed from above, and FIG. 7B is a schematic view when the lower case 32 of the mobile device 101 and the circuit board 10 are viewed from above. FIGS. 8A and 8B also illustrate the structure of the mobile device according to the second embodiment of the present invention; FIG. 8A is a schematic cross-sectional view of the mobile device 101 as taken along line VIIIA-VIIIA in FIG. 7A, and FIG. 8B is a schematic cross-sectional view in which the rear side of the circuit board 10 and the battery 80 in FIG. 8A are enlarged. FIGS. 9A and 9B also illustrate the structure of a mobile device according to a third embodiment of the present invention; FIG. 9A is a schematic view when a mobile device 201 is viewed from below, and FIG. 9B is a schematic cross-sectional view of the mobile device 201 as taken along line IXB-IXB in FIG. 9A.

In the above drawings, X1 indicates a direction toward the left side, X2 indicates a direction toward the right side, Y1 indicates a direction toward the front, Y2 indicates a direction toward the rear, Z1 indicates a direction toward the top, and Z2 indicates a direction toward the bottom. FIGS. 2A, 2B, 3A, 3B, and 6 illustrate the structure of the mobile device 1 in use, FIGS. 8A and 8B illustrate the structure of the mobile device 101 in use, and FIGS. 9A and 9B illustrate the structure of the mobile device 201 in use. In these drawings, the battery 80 is held in a battery holder 20. Although two switching elements 71 are connected to two wiring electrodes 14 in one-to-one correspondence, for easy comprehension of the structure of the mobile device 201, FIG. 9B illustrates only one wiring electrode 14 connected to one of the two switching elements 71.

First Embodiment

First, the structure of the mobile device according to the first embodiment of the present invention will be described with reference to FIGS. 1A and 1B to FIGS. 3A and 3B. The mobile device 1 according to the first embodiment is a mobile device used in a system called a keyless entry system. A keyless entry system includes a vehicle-mounted device, which is mounted in a vehicle, and a mobile device, called an electronic key, carried by the user of the vehicle. According to a result in wireless communication between the vehicle-mounted device and the mobile device, the keyless entry system allows a door of the vehicle to be locked or unlocked, allows the engine to be started, and performs other tasks. The mobile device 1 includes the circuit board 10 and battery holder 20 described above as well as a case member 30, as illustrated in FIGS. 1A and 1B to FIGS. 3A to 3B.

The circuit board 10 is a substantially rectangular wiring board having an upper surface 10a and a lower surface 10b, as illustrated in FIGS. 2A and 2B and FIGS. 3A to 3B. An electronic part 41 such as an IC chip is mounted at a predetermined position on the front side of the upper surface 10a of the circuit board 10, forming a certain electronic circuit 40. The electronic circuit 40 is used to perform wireless communication with a vehicle-mounted device (not illustrated).

Test ports 11 are provided at predetermined positions on the rear side of the upper surface 10a of the circuit board 10. The test ports 11 are test terminal electrodes used to inspect the performance of the electronic circuit 40 before the mobile device 1 is shipped as a product. The test ports 11 are electrically connected to the electronic circuit 40 through wiring electrodes (not illustrated). The test ports 11 are exposed to the upper surface 10a of the circuit board 10 so that a test probe (not illustrated) can come into contact with them from above.

Applications of the test ports 11 are appropriately determined according to, for example, the standard of the mobile device 1. Examples of these applications of the test ports 11 are to apply a power supply voltage to the electronic circuit 40, to transmit a control signal to the electronic circuit 40, and to transmit a false signal of an input signal. The test ports 11 may also be used to transmit certain information to the electronic circuit 40 before performance inspection or during maintenance. As described above, the test ports 11 are used in various applications, so there may be a case in which the test ports 11 cannot be grounded while the mobile device 1 is in use.

A ground electrode 12 is formed below the lower surface 10b of the circuit board 10 so as to cover areas facing the test ports 11 and the peripheries of the areas on the lower surface 10b of the circuit board 10, as illustrated in FIGS. 2A and 2B and FIGS. 3A to 3B. A ground electrode 13 is also formed on the upper surface 10a of the circuit board 10 so as to cover the peripheries of the test ports 11 on the upper surface 10a of the circuit board 10, as illustrated in FIGS. 2A and 2B and FIGS. 3A to 3B. The ground electrode 12 and ground electrode 13 are grounded through wiring electrodes (not illustrated).

The battery holder 20 holds the battery 80 from which electric power is supplied to the electronic circuit 40. The battery 80 is a button battery having a columnar outside shape as illustrated in FIGS. 2A and 2B and FIGS. 3A to 3B. The surfaces of the battery 80 are covered with a conductive member made of a metal or the like. The battery 80 has a first electrode surface 80a, which is one end surface, and a second electrode surface 80b, which is the other end surface, and an outer circumferential surface 80c. The first electrode surface 80a works as a ground electrode, the second electrode surface 80b works as a power supply electrode, and the outer circumferential surface 80c works as a member held by the battery holder 20.

The battery holder 20 has a plurality of plate-like parts 21 extending upward and downward, as illustrated in FIGS. 2A and 2B and FIGS. 3A to 3B. The plate-like parts 21 catch and hold the outer circumferential surface 80c of the battery 80. In this embodiment, the battery holder 20 holds the battery 80 so that it is located above the rear side of the circuit board 10. In addition, the battery holder 20 holds the battery 80 so that the battery 80 faces the upper surface 10a of the circuit board 10 with the second electrode surface 80b facing upwardly and the first electrode surface 80a facing downwardly. On the upper surface 10a of the circuit board 10, the test ports 11 described above are disposed in an opposing space R1 that faces the upper surface 10a of the circuit board 10 and the first electrode surface 80a of the battery 80 (simply referred to below as the opposing space R1 facing the circuit board 10 and the battery 80).

A contact member (not illustrated) for power supply use is provided on the same side as the upper end of the battery holder 20. The second electrode surface 80b of the battery 80 is electrically connected to a power supply electrode (not illustrated) of the electronic circuit 40 through the contact member. A contact member (not illustrated) used for grounding is also provided on the upper surface 10a of the circuit board 10. The first electrode surface 80a is grounded through the contact member and the like.

The case member 30 accommodates the circuit board 10 and battery holder 20. The case member 30 is a substantially rectangular parallelepiped member, which is made of a synthetic resin and shaped like a box, as illustrated in FIGS. 1A and 1B to FIGS. 3A to 3B. The case member 30 can be divided into the upper case 31 and lower case 32. The upper case 31 has a substantially rectangular top plate 31a and a side wall 31b extending downwardly from the outer circumference of the top plate 31a. The battery holder 20 is formed integrally with the upper case 31 at a predetermined position on the lower surface of the top plate 31a. The lower case 32 has a substantially rectangular bottom plate 32a and a side wall 32b extending upwardly from the outer circumference of the bottom plate 32a. The circuit board 10 is held on the bottom plate 32a.

An engaging part (not illustrated) is provided at a predetermined position on the side wall 31b of the upper case 31 so as to engage the lower case 32. A to-be-engaged part (not illustrated) is provided at a predetermined position on the side wall 32b of the lower case 32 so as to be engaged with the engaging part on the upper case 31. When the upper case 31 is attached to the lower case 32, the engaging part on the upper case 31 and the to-be-engaged part on the lower case 32 are engaged, combining the upper case 31 and lower case 32 together. The mobile device 1 is structured in this way.

Next, a method of assembling the mobile device 1 will be descried with reference to FIGS. 4A and 4B and FIGS. 5A and 5B. In the assembling of the mobile device 1, the circuit board 10 on which the electronic circuit 40 is formed is first attached to the lower case 32 as illustrated in FIG. 4A. Then, the circuit board 10 is attached to the lower case 32. In this state, the performance of the electronic circuit 40 is inspected.

In the performance inspection of the electronic circuit 40, electric power is supplied from a measuring instrument (not illustrated) to the electronic circuit 40. Therefore, the battery 80 is not necessary in the execution of performance inspection of the electronic circuit 40. Therefore, even if the battery 80 is not held at a position at which the battery 80 faces the test ports 11, the performance of the electronic circuit 40 can be inspected. For this reason, with the test ports 11 exposed as illustrated in FIG. 4B, a test probe (not illustrated) can be brought into contact with the test ports 11 from above.

After the performance inspection of the electronic circuit 40 has been completed, the battery 80 is attached to the battery holder 20 as illustrated in FIG. 5A. Next, the upper case 31 is attached to the lower case 32, so the engaging part (not illustrated) on the upper case 31 engages the to-be-engaged part (not illustrated) on the lower case 32. Then, the assembling of the mobile device 1 is completed as illustrated in FIG. 5B, enabling the battery holder 20 to hold the battery 80 at the position at which the battery 80 faces the test ports 11. In this state, the mobile device 1 is used as a mobile device of a keyless entry system. To prevent the battery 80 from being wasted, the mobile device 1 may be shipped with the battery 80 removed and the upper case 31 and lower case 32 may be separated immediately before the mobile device 1 is used, after which the battery 80 may be attached to the battery holder 20.

As described above, the test ports 11 are test terminal electrodes used to inspect the performance of the electronic circuit 40 and are not used while the mobile device 1 is in use. Therefore, even if the battery 80 is held at a position at which the battery 80 faces the test ports 11, the mobile device 1 can be used without a problem.

Next, effects of this embodiment will be described with reference to FIG. 6. With a mobile device that is used in a keyless entry system, such as the mobile device 1 in this embodiment, the case member 30 is made of a synthetic resin or another material through which electromagnetic waves can easily pass so that wireless communication with a vehicle-mounted device is not interfered. The test ports 11 are provided so as to be exposed to the upper surface 10a of the circuit board 10, and need to have a large size to a certain extent to enable a test probe to be easily brought into contact with the test ports 11. Accordingly, electromagnetic wave noise that has intruded from the outside of the mobile device 1 can easily enter the test ports 11. This has been problematic in that, if no countermeasures against noise are taken, the electromagnetic wave noise that has entered the test ports 11 may be transmitted toward the electronic circuit 40 and the electronic circuit 40 may thereby be adversely influenced.

The adverse influence of electromagnetic wave noise on the electronic circuit 40 is further increased if the test ports 11 are disposed near the wiring electrodes connected to the electronic part 41 such as an IC chip. However, a mobile device such as the mobile device 1 in this embodiment is required to be compact so as to be easy to carry. Therefore, the test ports 11 are often disposed near the wiring electrodes connected to the electronic part 41, in which case countermeasures against noise is particularly important. However, all test ports 11 cannot be always grounded as described above, so there has been the possibility that if countermeasures against noise are taken by grounding the test ports 11, the electronic circuit 40 does not function normally.

With the mobile device 1 in this embodiment, however, the battery holder 20 holds the battery 80 at a position at which the battery 80 faces the test ports 11 above the circuit board 10, as illustrated in FIG. 6. The surfaces of the battery 80 are covered with a conductive member made of a metal or the like. Therefore, on the surfaces of the battery 80, which is covered with a conductive member, it is possible to block electromagnetic wave noise that would otherwise intrude from above (on the same side as the battery 80) toward the test ports 11. As a result, the adverse influence of electromagnetic wave noise on the electronic circuit 40 can be suppressed without having to ground the test ports 11.

With the mobile device 1 in this embodiment, the battery 80 may be a button batty having the first electrode surface 80a and second electrode surface 80b as illustrated in FIG. 6. The battery holder 20 may hold the battery 80 so that the first electrode surface 80a of the battery 80 faces the upper surface 10a of the circuit board 10. The test ports 11 may be disposed in the opposing space R1 facing the circuit board 10 and the battery 80. Therefore, the upper portions of the test ports 11 are covered with the first electrode surface 80a of the battery 80, so even if the electromagnetic wave noise intrudes from above toward the test ports 11, it is possible to make it further hard for the electromagnetic wave noise to reach the test ports 11. As a result, the adverse influence of electromagnetic wave noise on the electronic circuit 40 can be further suppressed.

With the mobile device 1 in this embodiment, the ground electrode 12 may be provided on the lower surface 10b of the circuit board 10 so as to cover areas facing the test ports 11 and the peripheries of the areas, as illustrated in FIG. 6. A normal ground electrode is characterized in that it absorbs and attenuates electromagnetic waves. Therefore, it is possible to block electromagnetic wave noise that intrudes from below (on the side opposite to the battery 80) toward the test ports 11 by covering the areas facing the test ports 11 and the peripheries of the area with the ground electrode 12. As a result, the adverse influence of electromagnetic wave noise on the electronic circuit 40 can be further suppressed.

Although, in this embodiment, electromagnetic wave noise that intrudes from below toward the test ports 11 is blocked by covering the areas facing the test ports 11 and the peripheries of the areas with the ground electrode 12, this is not a limitation. A power supply electrode to which a certain voltage is applied is also characterized in that the power supply electrode absorbs and attenuates electromagnetic waves. Therefore, if the areas facing the test ports 11 and the peripheries of the areas are covered with a power supply electrode instead of the ground electrode 12, the same effect can be obtained.

With the mobile device 1 in this embodiment, the ground electrode 13 may be provided on the upper surface 10a of the circuit board 10 so as to enclose the peripheries of the test ports 11 as illustrated in FIG. 6. A normal ground electrode is characterized in that it absorbs and attenuates electromagnetic waves. Therefore, it is possible to block electromagnetic wave noise that intrudes from a clearance between the circuit board 10 and the battery 80 toward the test ports 11, such as electromagnetic wave noise that intrudes from diagonally above the test ports 11 toward the test ports 11, by using the ground electrode 13 before the electromagnetic wave noise reaches the test ports 11. As a result, the adverse influence of electromagnetic wave noise on the electronic circuit 40 can be further suppressed.

Although, in this embodiment, electromagnetic wave noise that intrudes from a clearance between the circuit board 10 and the battery 80 toward the test ports 11 is attenuated by enclosing the peripheries of the test ports 11 with the ground electrode 13, this is not a limitation. A power supply electrode to which a certain voltage is applied is also characterized in that the power supply electrode absorbs and attenuates electromagnetic waves. Therefore, if the peripheries of the test ports 11 are enclosed by a power supply electrode instead of the ground electrode 13, the same effect can be obtained.

Second Embodiment

Next, the structure of the mobile device according to the second embodiment of the present invention will be described with reference to FIGS. 7A and 7B and FIGS. 8A and 8B. In this embodiment, elements that are the same as in the first embodiment will be assigned the same reference characters and their detailed descriptions will be omitted.

The mobile device 101 according to the second embodiment of the present invention includes the circuit board 10 on which the electronic circuit 40 is formed, the battery holder 20, and the case member 30, as with the mobile device 1 according to the first embodiment. The test ports 11 are provided on the upper surface 10a of the circuit board 10. The battery holder 20 holds the battery 80 at a position at which the battery 80 faces the test ports 11.

In this embodiment, however, the mobile device 101 further includes a contact member 50 used for grounding, the contact member 50 being disposed on the upper surface 10a of the circuit board 10 as illustrated in FIG. 7B and FIGS. 8A and 8B. The contact member 50 is formed by machining a flexible metal plate to a predetermined shape. The contact member 50 is then disposed at a predetermined position on the upper surface 10a of the circuit board 10. A contact 51, which is brought into elastic contact with the first electrode surface 80a of the battery 80, is formed near the central portion of the contact member 50.

Protrusions 60 may be formed, on the upper surface 10a of the circuit board 10, at positions at which the protrusions 60 face the battery 80, the positions differing from the positions at which the test ports 11 are disposed, so as to extend upwardly (toward the battery 80). In this embodiment, the protrusions 60 are formed integrally with the contact member 50 in the vicinity of the outer circumference of the contact member 50. The height of each protrusion 60 is set so as to be substantially the same as the height of the first electrode surface 80a when the battery 80 is located at a position at which the battery 80 is held. Therefore, when the mobile device 101 has been assembled, the protrusions 60 are in contact with the first electrode surface 80a of the battery 80 and restrict the downward movement of the battery 80.

The contact member 50 and protrusions 60 as described above are obtained by, for example, machining a flexible metal plate to a predetermined shape. The contact member 50 is then fastened onto the ground electrode 13 by soldering or another method, so the protrusions 60 are fastened to the upper surface 10a of the circuit board 10.

Next, effects of this embodiment will be described. As in the first embodiment, with the mobile device 101 in this embodiment, electromagnetic wave noise that would otherwise intrude toward the test ports 11 is blocked on the surfaces of the battery 80, which is covered with a conductive member. Therefore, the adverse influence of electromagnetic wave noise on the electronic circuit 40 can be suppressed without having to ground the test ports 11.

As for a mobile device like the mobile device 101 in this embodiment, the shorter the distance between the battery 80 and the test ports 11 is, the easier it is to prevent electromagnetic wave noise from intruding from the clearance between the battery 80 and test ports 11. However, there has been the possibility that if the distance between the battery 80 and the test ports 11 is too short, when the battery 80 is moved downwardly for some reason and comes into contact with the test ports 11, the electronic circuit 40 does not function normally.

With the mobile device 101 in this embodiment, however, the protrusions 60 are formed, on the upper surface 10a of the circuit board 10, at positions at which the protrusions 60 face the battery 80, the positions differing from the positions at which the test ports 11 are disposed, so as to extend upwardly (toward the battery 80), as illustrated in FIGS. 7B, 8A, and 8B. Since the protrusions 60 are in contact with the first electrode surface 80a of the battery 80, it is possible to restrict the downward movement of the battery 80. As a result, even if the distance between the battery 80 and the test ports 11 is shortened, the distant can be still easily assured, so it is possible to prevent the electronic circuit 40 from not operating normally due to a contact between the battery 80 and test ports 11.

With the mobile device 101 in this embodiment, the protrusions 60 may be integrally formed with the contact member 50. Therefore, it is possible to reduce the number of parts to be assembled into the mobile device 101 and thereby simplify the assembling of the mobile device 101.

Although, in this embodiment, the protrusions 60 are in contact with the battery 80 to restrict its downward movement, this is not a limitation. For example, while the battery holder 20 normally holds the battery 80, the protrusion 60 may not be in contact with the battery 80, and only when the battery 80 is displaced downwardly, the protrusions 60 may come into contact with the battery 80 and may restrict its downward movement. Even in this arrangement, it is possible to prevent the electronic circuit 40 from not operating normally due to a contact between the battery 80 and test ports 11. In this case, the height of each protrusion 60 is set so as to be substantially the same as the height of the first electrode surface 80a when the battery 80 is located at a position at which the battery 80 is restricted so that it cannot be further moved downwardly.

Third Embodiment

Next, the structure of the mobile device according to the third embodiment of the present invention will be described with reference to FIGS. 9A and 9B. In this embodiment, elements that are the same as in the first embodiment will be assigned the same reference characters and their detailed descriptions will be omitted.

The mobile device 201 according to the third embodiment of the present invention includes the circuit board 10 on which the electronic circuit 40 is formed, the battery holder 20, and the case member 30, as with the mobile device 1 according to the first embodiment. The test ports 11 are provided on the upper surface 10a of the circuit board 10. The battery holder 20 holds the battery 80 at a position at which the battery 80 faces the test ports 11.

In this embodiment, however, the mobile device 201 may further include two input parts 70 that accept an input operation from an operator (not illustrated), as illustrated in FIGS. 9A and 9B. Examples of input operations performed by using the two input parts 70 include operations to command the locking and unlocking of a door of a vehicle (not illustrated).

Each input part 70 includes the switch element 71 and an operation part 72. The switch element 71, which is of pressing type, is mounted at a predetermined position on the lower surface 10b of the circuit board 10. The operation part 72 is placed below the switch element 71 and is held by the lower case 32 so as to be capable of being pressed, making the operation part 72 ready to accept an upward pressing operation. When the operation part 72 presses the lower end of the switch element 71 upwardly in response to a pressing operation by the operator, the connection state of the switch elements 71 is changed.

The wiring electrodes 14 are provided in an inner layer of the circuit board 10, each of which electrically connects the switch element 71 of the relevant input part 70 to the electronic circuit 40. The test ports 11 are electrically connected to the wiring electrodes 14. With the mobile device 201, the switch element 71 of each input parts 70 is electrically connected to predetermined test ports 11 through the relevant wiring electrode 14 in this way.

Next, effects of this embodiment will be described. As in the first embodiment, with the mobile device 201 in this embodiment, electromagnetic wave noise that would otherwise intrude toward the test ports 11 is blocked on the surfaces of the battery 80, which is covered with a conductive member. Therefore, the adverse influence of electromagnetic wave noise on the electronic circuit 40 can be suppressed without having to ground the test ports 11.

In addition, with the mobile device 201 in this embodiment, the connection state of the switch elements 71 is changed in response to an input operation by the operator. Since the switch element 71 of each input parts 70 is electrically connected to predetermined test ports 11 through the relevant wiring electrode 14, the test ports 11 cannot be grounded while the mobile device 101 is in use. Therefore, the effect of suppressing the adverse influence of electromagnetic wave noise on the electronic circuit 40 without having to ground the test ports 11 is particularly noticeable in a case in which there are test ports 11 electrically connected to the switch elements 71 of the input parts 70 as with the mobile device 201.

The electronic circuit 40 and input parts 70 are often placed distant from each other, in which case the wiring electrode 14 tends to be prolonged. The longer the wiring electrode 14 is, the more likely the wiring electrode 14 is to be adversely influenced by electromagnetic wave noise. Therefore, if the test ports 11 are disposed at intermediate points on the wiring electrodes 14, the adverse influence of the electromagnetic wave noise is further increased. Therefore, the effect of suppressing the adverse influence of electromagnetic wave noise on the electronic circuit 40 without having to ground the test ports 11 is further noticeable in a case in which the electronic circuit 40 and input parts 70 are placed distant from each other and the test ports 11 are disposed at intermediate points on the wiring electrode 14.

So far, the embodiments of the present invention have been described. However, the present invention is not limited to these embodiments. The present invention can be appropriately modified without departing from the intended scope of the present invention.

For example, in an embodiment of the present invention, the structure of the mobile device 1 may be appropriately changed if predetermined functions can be implemented. For example, the mobile device 1 may further include a key blade, which is an emergency mechanical key, a storage means in which predetermined information is stored, and a display means on which predetermined information is displayed. The electronic circuit 40 may include a control circuit that controls the storage means, the display means and the like and other circuits for use for other than wireless communication. This is also true for the mobile device 101 and mobile device 201.

In an embodiment of the present invention, the number of test ports 11 and their placement and shapes may be appropriately changed if predetermined functions can be implemented. Part of the test ports 11 may be outside the opposing space R1 if the adverse influence of electromagnetic wave noise on the electronic circuit 40 can be adequately suppressed.

In an embodiment of the present invention, the shape of the battery holder 20 may be appropriately changed if the battery 80 can be held at a predetermined position. The battery holder 20 may be formed as a member separate from the case member 30, and may be attached to the circuit board 10. The battery 80 may be other than a button battery.

In an embodiment of the present invention, the shape of the contact member 50, the number of protrusions 60, and their placement and shapes may be appropriately changed if predetermined functions can be implemented. The protrusion 60 may be formed as a member separate from the contact member 50 and may be secured directly onto the ground electrode 13.

In an embodiment of the present invention, the number of input parts 70 and their placement may be appropriately changed if predetermined functions can be implemented. The input parts 70 may be electrically connected to the electronic circuit 40 through the test ports 11.

In an embodiment of the present invention, the performance of the electronic circuit 40 may be inspected before the circuit board 10 is attached to the lower case 32, instead of inspecting the performance of the electronic circuit 40 with the circuit board 10 attached to the lower case 32.

What is claimed is:

1. A mobile device comprising:
a circuit board on which an electronic circuit used to perform wireless communication with a vehicle-mounted device is mounted;
a battery holder that holds a battery from which electric power is supplied to the electronic circuit, the battery comprising a button battery having two electrode surfaces; and
a case member having a plurality of cases, the battery holder being provided on a first one of the plurality of cases and the circuit board being accommodated in a second one of the plurality of cases;
wherein:
a test port is provided on one plate surface of the circuit board, the test port being a terminal electrode used in test of the electronic circuit, and
the battery holder holds the battery at a position at which the battery faces the test port; and
the battery holder holds the battery so that a first one of the two electrode surfaces of the battery faces the one plate surface; and the test port is disposed in an opposing space that faces the one plate surface and the one of the two electrode surfaces.

2. The mobile device according to claim 1, wherein a ground electrode or a power supply electrode is provided in an inner layer of the circuit board or on another plate surface of the circuit board so as to cover an area facing the test port and a periphery of the area.

3. The mobile device according to claim 1, wherein a ground electrode or a power supply electrode is provided on the one plate surface so as to enclose the test port.

4. The mobile device according to claim 1, wherein a protrusion is formed at a position on the one plate surface so as to extend toward the battery, the protrusion facing the battery at the position, the position differing from a position at which the test port is disposed.

5. The mobile device according to claim 4, further comprising a contact member formed on the one plate surface,
wherein the protrusion is integrally formed with the contact member.

6. The mobile device according to claim 1, further comprising an input part that accepts an input operation from an operator, wherein
a wiring electrode is provided on the circuit board, the wiring electrode electrically connecting the electronic circuit and the input part to each other, and
the test port is electrically connected to the wiring electrode.

7. The mobile device according to claim 1, comprising a contact member that electrically connects the second one of the two electrode surfaces of the battery holder and the electronic circuit to each other and wherein the contact member is disposed on the first one of the plurality of cases.

* * * * *